United States Patent [19]

Einthoven

[11] Patent Number: 5,399,901
[45] Date of Patent: Mar. 21, 1995

[54] SEMICONDUCTOR DEVICES HAVING A MESA STRUCTURE AND METHOD OF FABRICATION FOR IMPROVED SURFACE VOLTAGE BREAKDOWN CHARACTERISTICS

[75] Inventor: W. G. Einthoven, Belle Mead, N.J.

[73] Assignee: General Instrument Corp., Hatboro, Pa.

[21] Appl. No.: 230,299

[22] Filed: Apr. 20, 1994

[51] Int. Cl.$^6$ .............................................. H01L 29/06
[52] U.S. Cl. .................... 257/623; 257/627; 156/647; 148/106; 148/DIG. 115
[58] Field of Search .................. 257/618, 623, 627; 156/647, 644, 649; 148/DIG. 51, DIG. 102, DIG. 115, DIG. 106; 437/8, 225

[56] References Cited

U.S. PATENT DOCUMENTS

| | | | |
|---|---|---|---|
| 3,765,969 | 10/1973 | Kragness et al. | 156/17 |
| 4,155,783 | 5/1979 | Feist | 148/33.2 |
| 4,255,757 | 3/1981 | Hikin | 357/58 |
| 4,373,255 | 2/1983 | Goronkin | 29/580 |
| 4,740,477 | 4/1988 | Einthoven et al. | 437/8 |
| 4,891,685 | 1/1990 | Einthoven et al. | 357/56 |
| 5,020,023 | 4/1991 | Einthoven et al. | 437/8 |

*Primary Examiner*—Jerome Jackson
*Assistant Examiner*—Donald L. Monin

[57] ABSTRACT

A semiconductor rectifier device includes a mesa structure formed on a surface of a monocrystalline silicon wafer, the mesa having four side walls meeting at rounded corner walls. The slope of the mesa side walls is 45 degrees and the slope of each corner wall varies between 45 and 54 degrees. The mesa is fabricated by providing a square etchant mask having rounded corners on a <100> crystal plane of a silicon wafer with the straight sides of the mask disposed at an angle of 45 degrees with <111> directions on the wafer surface. The mask corners are symmetrical and comprise, from a mid point of the corners, oppositely extending short straight lines forming an angle of 150 degrees or less therebetween. The rear end of each short line is connected by a series of end to end straight lines angled relative to one another to form a generally smooth line merging with straight sides of the mask. The lengths of the short straight lines are related to the location of a surface intercept of a P-N junction within the mesa structure with the mesa side walls, and the angles between the short straight lines are related to the desired maximum variations in the location of the surface intercept of a high-low junction within the mesa with the mesa side walls. The mesa structure is formed by anisotropically etching the masked silicon wafer.

9 Claims, 3 Drawing Sheets

SEMICONDUCTOR DEVICES HAVING A MESA STRUCTURE AND METHOD OF FABRICATION FOR IMPROVED SURFACE VOLTAGE BREAKDOWN CHARACTERISTICS

BACKGROUND OF THE INVENTION

This invention relates to semiconductor devices having a mesa structure, and particularly to the configuration and fabrication of the mesa structure.

The present invention is an improvement of those disclosed in my U.S. Pat. Nos. 4,740,477, 4,891,685 and 5,010,023, the subject matter of which is incorporated herein by reference.

These patents show rectifier devices comprising a mesa structure, particularly a frustum shaped mesa having a circular cross-section. The mesa contains various doped regions including an $N^+ \ N^-$ junction which is generally parallel to the base plane of the mesa and which intercepts the side wall of the mesa. At the side wall, the plane of the $N^+ \ N^-$ junction curves slightly upwardly. As explained in the patents, the combination of a sloped mesa wall and a curved $N^+ \ N^-$ intercept therewith results in the voltage breakdown characteristics at the side of the mesa being improved, whereby problems associated with voltage breakdowns at surface intercepts of voltage blocking p-n junctions are reduced.

The theory concerning surface voltage breakdown is presented by O. Melville Clark in U.S. Pat. No. 3,260,634 (Jul. 12, 1966) and by R. L. Davies, et al, in "Control of Electric Field at the Surface of P-N Junctions," IEEE Transactions on Electron Devices, July, 1964, pp. 313–323. The Davies article describes the use of mesas having sloped side walls. In the devices experimented with by Davies et al, sloped walls were obtained by mechanical means, e.g., grinding. However, in semiconductor devices using modern manufacturing techniques, the use of various mechanical means for providing mesa structures is quite impractical.

In my above cited patents, conventional photolithographic techniques are used involving anisotropic etching using a circular mask. The result, as shown in my patents, are frustro-conical mesas. A problem, however, is that using known anisotropic etching techniques, the actual slope of the mesa wall varies rather significantly from point to point around the periphery of the conical mesa. In general, the mesa conical wall has a slope of around 45 degrees, as measured from the mesa base plane, which is generally desirable, but the wall includes, as an inherent result of the anisotropic etching process, four bulges, disposed at 90 degrees from one another around the mesa periphery, where the wall slope increases to around 54 degrees. These variations in mesa wall slopes tend to provide non-uniform device characteristics around the periphery of the mesa and must be taken into account in the design of the rectifier devices. In general, better devices, more easily mass produced, result if the slope variations, at least in frustro-conical mesas, are not present or greatly reduced in size.

My patents also mention the use of a mesa having a generally square cross-section with rounded corners. As described hereinafter, such a square-shaped mesa does indeed provide improved results in accordance with the present invention, but with certain requirements not known to me at the time of filing of the applications resulting in my above-cited patents and only recently worked out by me after extensive observations and analyses.

SUMMARY OF THE INVENTION

A semiconductor device comprises a monocrystalline silicon wafer having a major surface lying in the <100> crystal plane. Disposed on the surface is a mesa having a generally square cross-section with generally rounded corners. The mesa has four main side walls each having a slope of 45 degrees with respect to the base plane of the mesa, and the horizontal edges of the main side walls are disposed at an angle of 45 degrees to the <111> directions on the wafer surface. The corner side walls of the mesa comprise generally conical surfaces having slopes varying between 45 and 54 degrees. A high-low ($N^+ \ N^-$ or $P^+ \ P^-$) junction is disposed within the mesa and makes a continuous line intercept with the mesa side walls around the entire periphery of the mesa. Along the side walls, the high-low junction intercept is parallel to the main side wall horizontal edges. Along the corner walls, the junction intercept curves relative to the corner horizontal edges in proportion to the change in slope along the corners.

A method of fabrication of the devices comprises forming an etchant mask on a <100> plane surface of a monocrystalline silicon wafer. The mask has a generally square shape with straight sides meeting at generally rounded corners. The mask straight sides are disposed at an angle of 45 degrees with the <111> directions on the silicon surface. The mask corners are symmetrical around an axis passing through mid-points of the corners. From such corner mid-point, each corner edge comprises two oppositely extending straight lines each forming an angle of about 15 degrees to the <111> direction on the crystal surface. At the corner mid-point, the two intersecting straight lines thus form an angle of about 150 degrees. From the opposite ends of the two straight lines, the corner edge curves generally smoothly to merge with the mask straight sides. The curvature of the corner edge is, as described hereinafter, a function of a vertical distance of the mesa to be formed. The silicon wafer is then immersed in an etchant for anisotropically etching the silicon for forming a mesa underlying the etchant mask. Doped regions are provided in the mesa having a high-low junction therebetween which forms a surface intercept with the mesa side walls. Then, as described in my afore-cited patents, the workpiece is heated for causing the high-low junction to move deeper into the mesa for providing a desired configuration of the surface intercept of the high-low junction with the mesa side walls.

DESCRIPTION OF THE DRAWING

The drawings are schematic and not drawn to scale.

DESCRIPTION OF PREFERRED EMBODIMENTS

Figure 1:
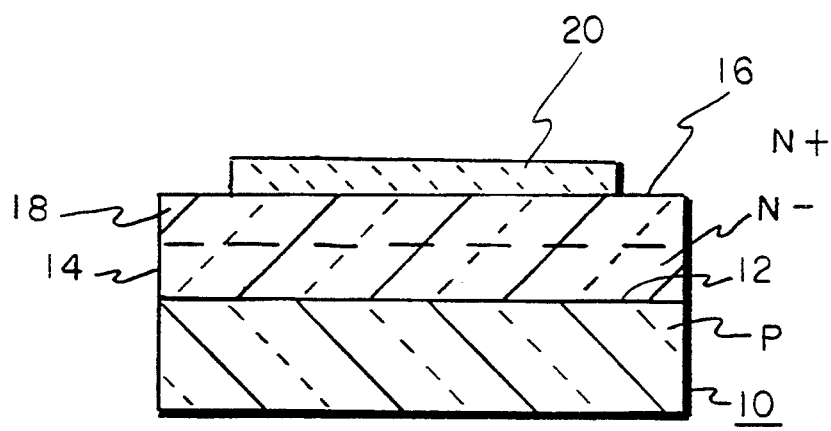
FIG. 1 is a cross section of a silicon wafer having an etchant mask on a surface of the wafer.

Similarly as in my afore-cited patents, the semiconductor device of the present invention utilizes a mesa structure to obtain improved breakdown voltage characteristics and particularly a higher breakdown voltage at the surface of the device. This result is accomplished by providing a high ohmic region between heavily doped P-type and N-type regions wherein the width of the high ohmic region is greater at its edges than in the central portion thereof. Since the high ohmic portion is wider along the sloped side wall of the mesa than in the bulk semiconductor material, a higher breakdown voltage can be achieved at the surface of the mesa than within the bulk of the mesa. As known, this is generally desirable for improving device reliability and utility.

Up until the fabrication of the mesa structure, semiconductor devices according to the present invention can be fabricated exactly as described in my patents.

Thus, starting with a monocrystalline silicon wafer 10 (FIG. 1) having a <100> crystal orientation, that is, having a major surface 12 perpendicular to the <100> crystal axis, and with the wafer 10 being of P+ conductivity type, a layer 14 of N− crystalline silicon is epitaxially grown on the surface 12 of the wafer 10. The grown layer 14 is automatically oriented similarly as the surface on which it is grown, hence the surface 16 of the layer 14 also lies in the <100> crystal plane. The interface 12 between the layer 14 and the wafer 10 comprises an N−P+ junction. Impurities, e.g., phosphorus atoms, are deposited, e.g., by ion implantation, within a thin layer at the top of the epitaxial layer 14 to form a high concentration N+ region 18. Then, a silicon nitride layer 20 is deposited on the upper surface 16 of the layer 14 and, using known photolithographic processes, the nitride layer 20 is patterned into an etchant mask 22 as shown in FIG. 2.

Figure 2:
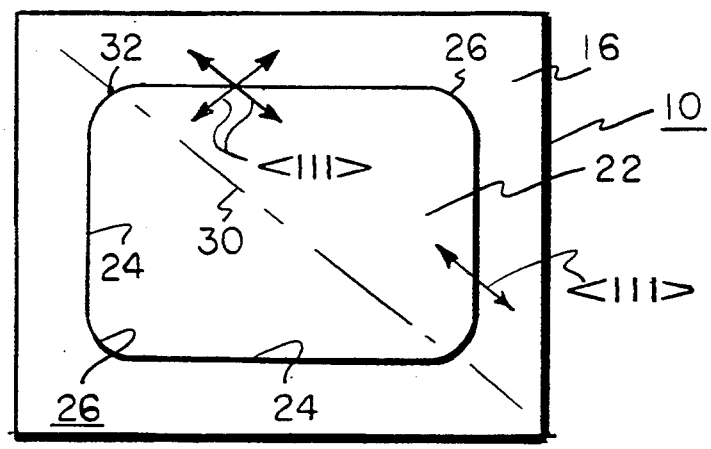
FIG. 2 is a plan view of the wafer shown in FIG. 1.

The wafer 10 shown in FIGS. 1 and 2 is to be fabricated into a rectifier. The invention is not limited to rectifier devices but can be used in any number of different devices employing mesa structures. For example, by adding a P type region within the N+ region 18, a transistor type device can be made. Various semiconductor devices employing mesas are known, hence illustration and description thereof are not necessary.

Returning to consideration of FIG. 2, both the orientation and configuration of the mask 22 are critical.

First, as shown in FIG. 2, the mask 22 has four straight sides 24 forming a square, although a rectangular shape can also be used. Each of the four sides 24 is disposed at an angle of 45 degrees to the <111> directions on the wafer surface 16. (In <100> silicon crystals, two <111> directions are present on the surface at right angles to one another.)

As described hereinafter, anisotropic etching is used to form a mesa structure beneath the etchant mask 22. Anisotropic etching is well known for forming various sloped surfaces in silicon crystals, e.g., surfaces of mesas, cavities and trenches. To my knowledge, in conventional practice, when using wafers having major surfaces lying in the <100> plane, the sides of rectilinear etchant masks are aligned parallel to the <111> directions. As known, such alignment of the mask edges results in etched side walls having a 54 degree slope, and corner walls having a 45 degree slope. By disposing the sides 24 of the mask 22 (FIG. 2) at 45 degrees to the <111> directions, in accordance with this invention, the etched walls defined by the mask sides 24 have slopes of 45 degrees substantially uniformly around the entire periphery of the mesa except for small portions of the mesa corners where a 54 degree slope occurs. However, as hereinafter described, the presence of such variations of slope at the mesa corners does not introduce undesirable variations in device characteristics.

Figure 3:
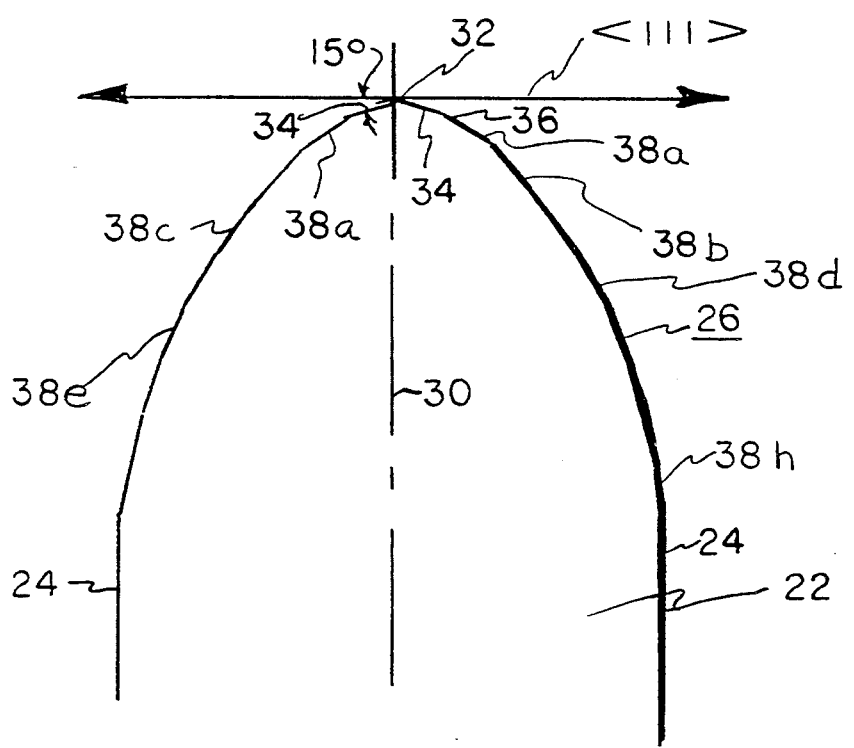
FIG. 3 is an enlarged view of a corner of the etchant mask shown in FIG. 2, the curvature of the corner being shown greatly exaggerated.

As shown in FIG. 2, the corners 26 of the mask 22 are generally rounded. An enlarged corner 26 is shown in FIG. 3, where the corner is seen to consist of straight lines. (In FIG. 3, the curvature of the corner is shown greatly exaggerated for ease of illustration.) Such straight lines result from the use of photomasks generated using known computer aided mask making tools. Typically, the computer prints out the desired photomask image edges using tiny straight lines. Provided the basic shape of the corner 26 schematically illustrated in FIG. 3 is maintained, certain ones of the straight lines shown can be replaced with a smoothly curved line.

The corner 26 is symmetrical about an axis 30 passing through a midpoint 32 of the corner edge. In FIG. 2, with a square shaped mask 22, the axis 30 is a diagonal of the square.

Starting from the mid-point 32, the corner edge consists of two straight lines meeting at the point 32 and forming an angle of 150 degrees at the point. FIG. 3 shows the crystal <111> direction (disposed at 45 degrees to the mask straight sides 24, as previously noted, but appearing at a different angle in FIG. 3 because of the curvature exaggeration shown in FIG. 3), and each line 34 is disposed at an angle of 15 degrees from the <111> direction.

The angular orientation of the corner lines 34 relative to the <111> direction is critical for obtaining mesas having desired slopes at the mesa corners. Particularly, I have observed that with etchant masks having edges which are oriented more than about 12 degrees from the <111> directions on silicon surfaces lying in the <100> plane, the walls anisotropically etched at the mask edges have a consistent, and desirable, slope of 45 degrees. Conversely, if the mask edges are disposed less than 12 degrees from the <111> directions, slopes varying between 45 and 54 degrees result. Such variation in slopes is undesirable. Although about 12 degrees is the critical angle, owing to manufacturing tolerances in aligning wafers, an angle of 15 degrees relative to the <111> direction is specified for the corner lines 34.

From each end 36 of the lines 34, eight short lines 38a–38h complete the corner sides and merge with the straight sides 24 of the mask 22. With the lines 34 being disposed at 15 degrees relative to the <111> directions, the eight lines 38a–38h must provide a total curvature of 30 degrees for each half of a corner.

In a preferred embodiment, the angular deviation from a straight line at the intersections of each pair of the eight lines 38a–38h is 3.75 degrees (that is, seven angles of 3.75 degrees at each intersection, for a total curvature of 26.25 degrees), and the angular deviation between the first line 38a and the mid-point line 34 and between the last line 38h and the mask straight side 24 is 1.875 degrees (for an added curvature of 3.75 degrees, thus adding up to the previously mentioned curvature of 30 degrees).

Figure 4:
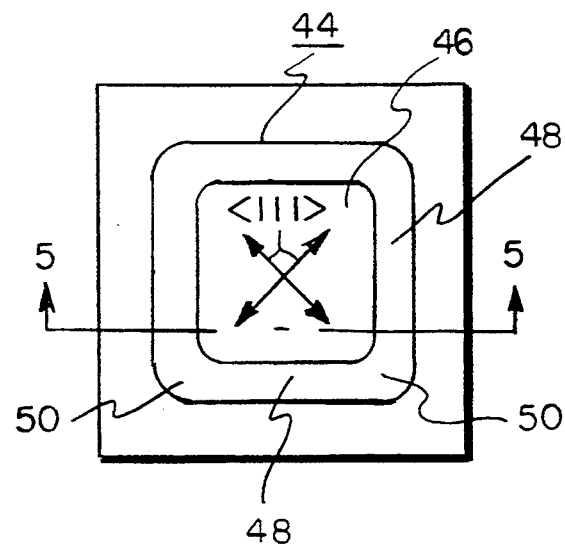
FIG. 4 is a view similar to FIG. 2 but after the wafer has been anisotropically etched to provide a mesa structure.
Figure 5:
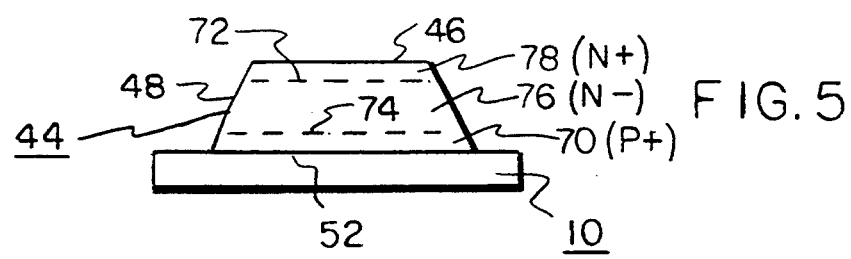
FIG. 5 is a cross sectional view taken along line 5—5 of FIG. 4.

With the mask 22 in place, the masked silicon wafer is then anisotropically etched using a known anisotropic etchant, e.g., hot ethylene diamine. The result of such etching process is shown in FIGS. 4 and 5. For purposes of illustration, the resulting mesa structure 44 is shown with the silicon nitride mask 22 removed and with the side of the mesa without any covering layer. The actual sequence of processes used is as disclosed in my patents, where the etchant mask is not removed until the sides of the mesa are covered with a grown layer of silicon dioxide.

Comparing the top surface 46 of the mesa 44 shown in FIG. 4 with the mask 22 shown in FIG. 2, it is seen that the shape of the mesa top surface 46 closely matches that of the mask 22.

The mesa structure 44 is, in conformity with the mask 22, in the shape of a square having four major side walls 48 and four generally rounded corner walls 50. As a result of the mask side edges having been disposed at 45 degrees to the <111> crystal directions (i.e., more than the aforementioned 15 degrees), the mesa major side walls have (FIG. 5) uniform slopes of 45 degrees with respect to the base plane 52 of the mesa 44.

Figure 6:
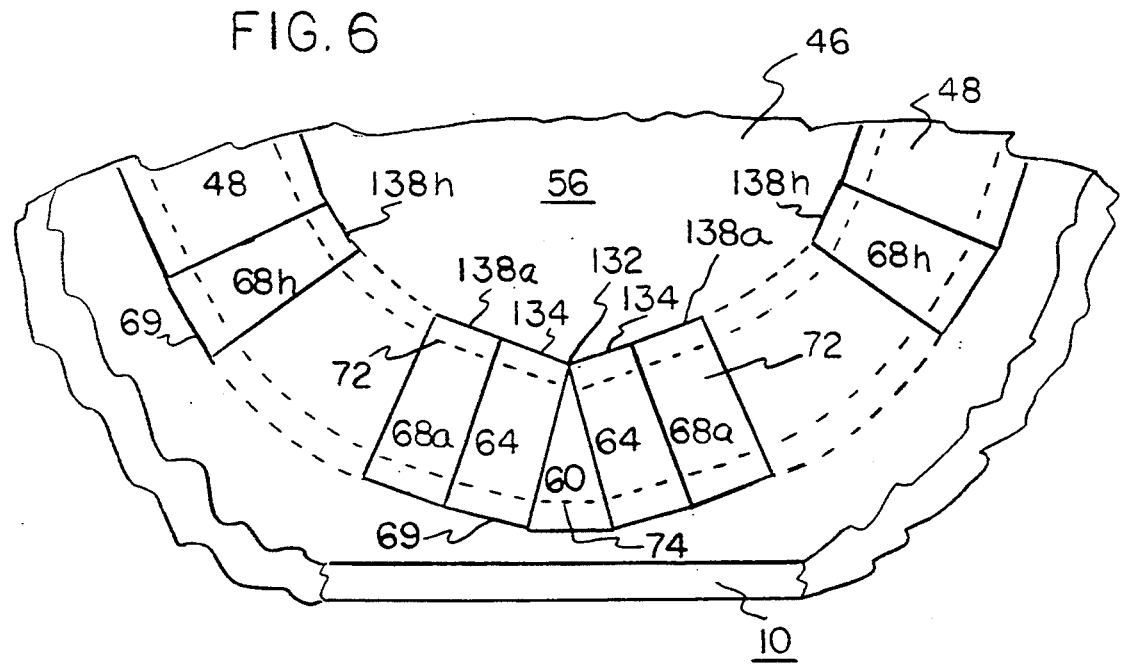
FIG. 6 is a perspective view, on an enlarged scale, of a corner of the mesa shown in FIG. 4, the curvature of the corner being shown greatly exaggerated.

The corner walls 50 do not have uniform slopes, but slopes which vary between 45 and 54 degrees. One mesa corner 56 is shown in FIG. 6. In FIG. 6, the curvature of the corner edges is arbitrarily selected for convenience of illustration.

The upper surface 46 of the mesa at the corner 56 conforms substantially to the shape of the corner 26 of the mask 22 shown in FIG. 3 (but with a different illustrated curvature), and reference numerals corresponding to those used in FIG. 3 for the mask 22 are used in FIG. 6 for the resulting mesa. Thus, the corner 56 includes a mid-point 132 from which two lines 134 diverge, followed by eight end-to-end lines 138a–138h. The corner wall 50 includes nineteen facets, eighteen of which have approximately the same slope. Thus, starting from the corner mid-point 132, a triangular facet 60 is present which has a slope, between the facet plane and the horizontal base plane 52 (FIG. 4) of the mesa 44, of 54 degrees. That is, the facet 60 lies in one of the <111> planes of the silicon crystal.

The triangular facet 60 is connected to each of the mesa straight walls 48 by a series of nine facets 64 and 68a–68h, each extending from one of the straight lines 134 and 138a–138h, respectively, at the top edge of the mesa to the mesa base edge 69. The slopes of the nine facets 64 and 68a–68h are all about 45 degrees.

FIG. 5 shows the location of the differently doped regions within the mesa 44. As shown, the P+ region 70 present in the starting silicon wafer 10 (FIG. 1) normally extends into the base of the mesa. This results from the mesa etching normally proceeding into the bulk of the original wafer 10 whereby the height of the mesa is slightly greater than the thickness of the epitaxial layer 12 grown (FIG. 1) on the wafer 10. Also, although the various junctions 72 and 74 (FIG. 5) between the differently doped regions (P+ region 70, N− region 76 and N+ region 78) now form surface intercepts with the side walls of the mesa 44, the junctions 72 and 74 lie in parallel planes.

In the present embodiment, the starting silicon wafers 10 (FIG. 1) includes the various P+, N− and N+ regions. Alternatively, the N+ region 78 (FIG. 5) can be added, e.g., by ion implantation, after the mesa structure 44 has been formed. The device shown in FIG. 5 is then heated for diffusing impurities in the upper N+ region 78 deeper into the mesa 44. As before, for ease of illustration, the masking layer 22 (FIG. 2) and a passivating layer of silicon dioxide present during such diffusion step are not shown.

Figure 7:
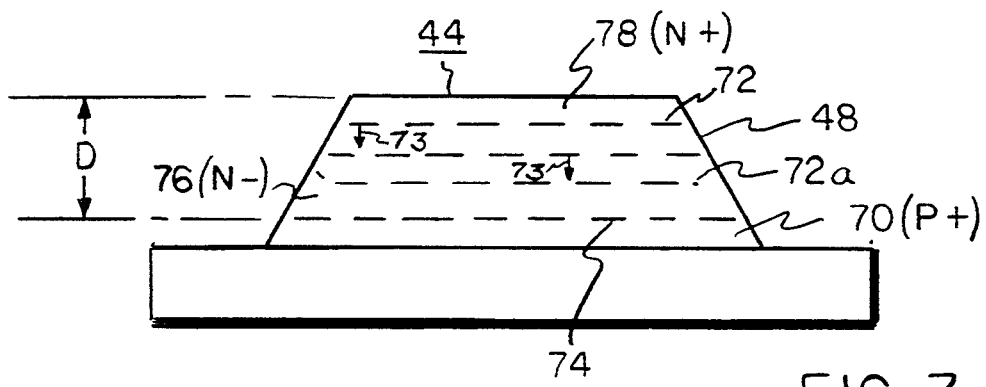
FIG. 7 is a view similar to FIG. 5 and illustrating the effect of heating the wafer for causing diffusion of dopants within the mesa downwardly and laterally within the mesa.

As illustrated in FIG. 7, as the N+ region 78 diffuses downwardly into the mesa, as indicted by the arrows 73, the N+N− junction 72 between the N+ region 78 and the N− region 76 takes on an increasingly large curvature along the mesa walls. Such curvature results from the facts that, within the bulk of the mesa, the areas of successively deeper levels of the mesa remain constant. Thus, the concentration of dopants in the advancing diffusion front diminish uniformly across the diffusion front.

Along the mesa sloped sides, however, the area of the N+N− interface 72 increases with depth, and lateral diffusions occur from the advancing diffusion front into such mesa sides. Accordingly, the concentration of the diffusion front along the mesa sides decreases more rapidly than in the bulk of the mesa, hence the N+N− junction 72 curves upwardly at the mesa side walls.

An advantage provided by such curved N+N− junction 72 is that the thickness of the N− region 76 is greater at the mesa sides than in the interior of the mesa 44. With a low doping concentration of the N− region, voltage breakdown across a given N− region is a function of the thickness thereof, hence the voltage breakdown at the surface of the mesa sides is greater than that within the mesa interior.

The foregoing is known and described in my patents.

In general, subject to certain limitations not necessary to discuss here, the rate of curvature increase of the N+N− junction is inversely related to the angle of slope of the mesa side walls relative to the mesa base plane. (With perfectly vertical, 90 degree sloped walls, for example, no increase of area with diffusion depth occurs, and little or no junction curvature results.)

As discussed in the Background of the Invention Section herein, a problem with the frustro-conical mesas disclosed in my afore-cited patents is that bulges are present in the mesa side walls where the slope increases from 45 degrees to 54 degrees. In such bulges, the junction curvature is reduced in proportion as the side wall slope increases, and the side wall voltage breakdown capability is accordingly reduced. Because the operating characteristics of the rectifier device must take into account all possibilities of surface breakdown, the operating characteristics of the rectifier are determined solely by the surface breakdown characteristics present at the 54 degree sloped bulges and not by the superior characteristics present at the 45 degree sloped walls. In effect, the 45 degree slope is "wasted."

In accordance with the present invention, however, the exact opposite result is achieved. Thus, in spite of the presence of mesa side walls (the corner facets 60) having slopes of 54 degrees, the rectifier device functions as if all the walls have a slope of 45 degrees. The inventive rectifiers thus take full advantage of the 45 degree sloped walls and are not limited, as in the past, by the presence of 54 degree sloped walls.

Figure 8:
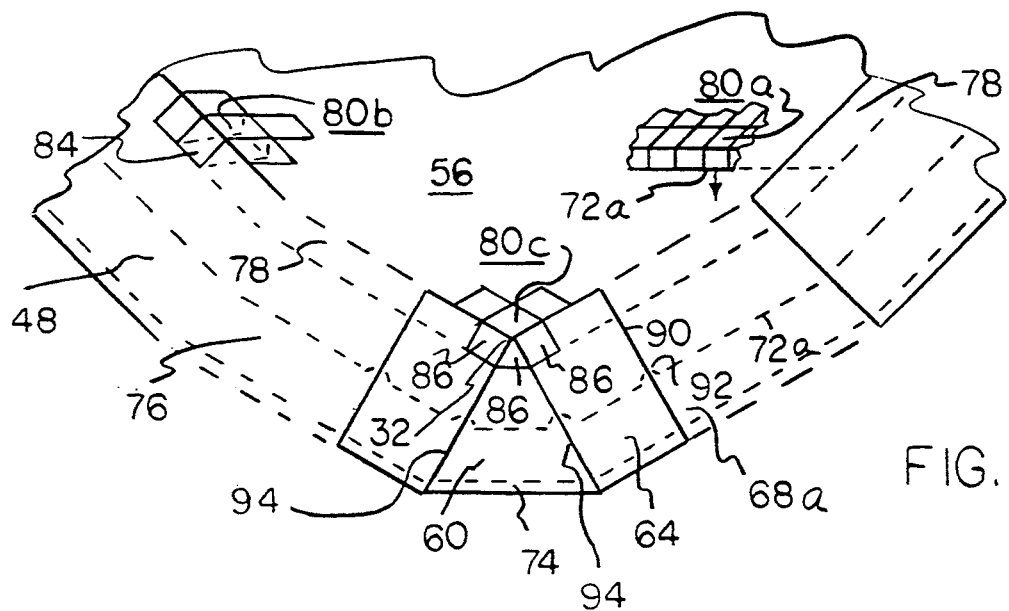
FIG. 8 is a view similar to that of FIG. 6 illustrating the dopant diffusion process.

The reason for this desirable result is illustrated in FIG. 8.

Shown in FIG. 8 are various "unit cubes" 80 within and extending from top to bottom of the N+ region 78. One unit 80a is disposed inwardly of the edges of the mesa and is surrounded on all sides by similar units. Another unit 80b is disposed along a straight side 48 of the mesa and is adjoined on three sides by adjacent units. The side 84 of the unit 80b forms part of the sloped wall 48 of the mesa. A third unit 80c is disposed at the mid-point 32 of the corner 56 and is adjoined on two sides by adjacent units. Three sides 86 of the unit 80c form part of the sloped walls meeting at the corner mid-point 32.

During the previously described heating step, dopants in each of the various unit cubes diffuse downwardly into the underlying N− region. The direction of diffusion is a function of the dopant gradient, and diffusions can occur vertically and laterally.

In the case of the unit cube 80a disposed interiorly of the mesa, all diffusion of dopants from within the cube can be assumed to occur directly downwardly because, in directions to any side of the unit cube 80a, similar downward diffusions from adjoining unit cubes are occurring.

In the case of the unit cube 80b at the straight side 48 of the mesa, owing to the slope of the mesa wall 48, the area of the N− region 76 to the left of the cube side 84 (as illustrated) increases in proportion to the depth of diffusion. Accordingly, lateral diffusion of dopants from the unit cube 80b in the direction of the left side 84 of the cube occurs simultaneously with downward diffusion of dopants from the cube. The result is that depletion of dopants from the unit cube 80b occurs more rapidly than the depletion of dopants from the interior unit 80a, and the advance of the N+N− junction 72 beneath the unit cube 80b proceeds more slowly than beneath the interior unit cubes. Accordingly, the N+N− junction 72 curves upwardly at the mesa sides as shown in FIG. 7.

In the case of the unit cube 80c at the mesa corner, the area of the underlying N+ region 76 expands in three directions with increases of mesa depth, i.e., in the directions of the three sides 86 of the cube forming the mesa corner walls, hence lateral diffusion from the cube 80c also occurs in three directions. Accordingly, the N+N− junction 72 underlying the unit 80c tends to lag even behind the rate of advance of the N+N− junction beneath the unit cube 80b.

As previously explained, the rate of growth of the area of the N− region into which the N+ region expands is a function of the slope of the side wall of the mesa. For slope angles measured with respect to the base plane of the mesa, the rate of growth of lateral area increases with smaller slope.

At the mesa corners, the slope of the triangular plane 60 (FIG. 6) at the corner mid-points 132 is 54 degrees and, based solely upon the relative slopes, it would be expected that the curvature in the plane of the N+N− junction 72 at the corner triangular planes 60 (of 54 degree slope) would be less than along the mesa straight sides (of 45 degree slope). However, owing to the greater lateral diffusion which occurs with increasing mesa depth beneath the corner midpoints 132, the actual curvature in the N+N− junction 72 adjacent to the triangular planes 60 is comparable to that near the straight sides of the mesa.

The actual curvature from point to point around the corners is a function of the wall slope at each point and the extent of the lateral exposure of the sides of the unit cubes at each point. This is illustrated in FIG. 8 which shows the surface intercept of the N+N− junction 72a around the corner after the diffusion step. In terms of the overall device design and characteristics, optimum results are obtained if the distance between the surface intercept 72a and the N−P+ junction 74 at the base of the mesa is substantially uniform around the entire periphery of the mesa. As shown in FIG. 8, this condition is met in spite of the fact that the slopes at the mesa mid-corners are greater than the slope at the mesa straight sides.

With respect to the corner facets 64 and 68a–68h, all these facets have a slope of about 45 degrees, as previously explained, hence have the same slope as that of the main side walls 48 of the mesa structure 44. Accordingly, the N+N− junction surface intercept 72a along these facets and main side walls comprises a generally straight line substantially everywhere parallel to the surface intercept 74a of the N−P+ junction 74.

Quite minor exceptions to the foregoing statement occur along the various vertical edges where the different facets adjoin one another. At such edges, e.g., the edge 90 between adjacent facets 64 and 68a, a slight cusp 92 is present. This occurs because of lateral diffusion that occurs in two directions at the vertical edge resulting, as above described, in a slight lagging behind of the downward movement of the N−N+ junction 72a. However, owing to the extremely small deviation from a straight line (e.g., the aforementioned 3.75 degrees) which exists between the two facets 64 and 68a, the effect of the edge 90 therebetween is so small that, for all practical purposes, the presence of the cusp 92 can be ignored. To the extent that the various mesa top edges 134 and 138a–138h intersect at more acute angles, e.g., with deviations from straight lines in excess of the specified 3.75 degrees, the cusps 92 are of greater dimensions and provide the device with greater variability of device characteristics. This is preferably avoided. In general, and dependent upon the particular rectifier device being made, the maximum angular deviation from a straight line between end to end connected mesa edges 134 and 138a–138h is not greater than about 10 degrees.

The triangular facet 60 at the mid-point 132 of the mesa corners has a slope of 54 degrees, hence differs in slope by 9 degrees from the adjoining facets 64 having 45 degree slopes. However, even at the vertical edges 94 of these adjoining facets 60 and 64, large cusps are avoided. This follows from the fact that, owing to the greater lateral diffusion that occurs from the unit cube 80c at the corner mid-point 132, as above-described, the junction surface intercept 72a along the 54 degree slope facet 60 is substantially at the same mesa height as the surface intercepts 72a along the other mesa side walls, all of which have 45 degree slopes.

Now discussed are the lengths of the mask 22 (FIG. 3) corner sides.

Figure 9:
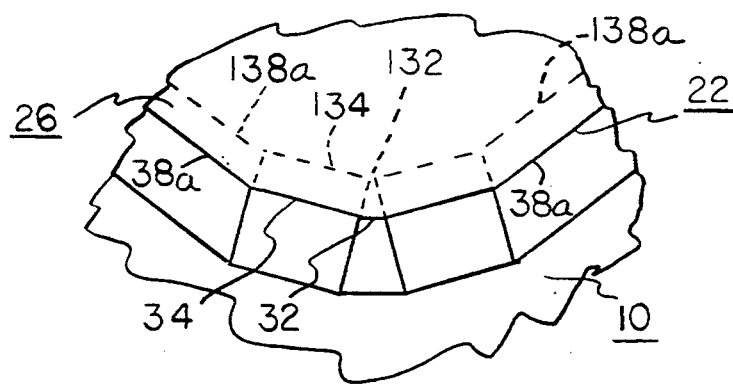
FIG. 9 is a plan view of a portion of a corner of an etched mesa structure with the etchant mask still in place.

During etching of the mesa structure, etching of the silicon occurs laterally beneath the etchant mask 22 as well as vertically. This is indicated in FIG. 9 which shows, in dashed lines, the position of the mesa top surface corner edges 134 and 138a inwardly of the mask corresponding edges at the conclusion of the etching process. Because of the curvature at the mask corners 26, the lengths of the various etched back mesa top edges 134 and 138*a* (as well as the other edges 138*b*–138*h*, not shown) are shorter than the corresponding mask edges 34 and 38*a*. The amount of undercutting of the mask edges is a function of the height of the mesa. With 45 degree sloped mesa walls, for example, the lateral etching of the silicon wafer equals the vertical etching thereof. With increasing vertical and accompanying lateral etching, the mesa corner top edges get shorter and shorter and, unless the mesa edges have a minimum length at the start of the etching process, can become too short.

As previously explained, at the various vertical edges between adjoining corner facets, e.g., the edge 90 (FIG. 8) between the adjacent facets 64 and 68*a*, there is a tendency for a cusp 92 to form in the N+N− junction surface intercept 72*a*. Such cusp occurs because of increased lateral diffusion of impurities from "unit cubes" disposed overlying the vertical edges. It also occurs that if the mesa top edges 134, 138*a*–138*h* become excessively short, the volume of the N+ doped region 78 available to provide dopants for lateral diffusions into closely spaced apart facet vertical edges is inadequate to provide all the dopants needed. Accordingly, the various cusps 92 become even larger and introduce larger undesirable variations in the characteristics of the device.

The minimum lengths of the mesa corner edges is a function of various device design parameters, e.g., the vertical location of the N+N− surface intercept 72*a* on the mesa side walls, the doping concentrations used and the permitted variation in device characteristics. As a general role, however, in order to obtain mesa corner top edges of adequate lengths at the conclusion of the etching process, the lengths of the various lines 34 and 38*a*–38*h* of the mask 22 (which lengths determine the lengths of the mesa edges at the start of the etching process) are preferably equal to a distance from the top surface 46 of the mesa structure to below the depth of the N+N− junction surface intercept, and, in general, about equal to about the depth of the N−P+ junction 74 in the mesa structure. In FIG. 7, such depth is indicated by the dimension D.

Taking into account the specified angular orientations between the various lines 34 and 38*a*–38*h* of the mask 22 and the foregoing specified lengths of these lines, it is possible to specify the mask corner dimensions in terms of the arc lengths thereof. Specifically, for each curvature of six degrees, the length of the mask corner edge should be equal to or larger than the distance D.

The lengths of the mask lines 34 and 38*a*–38*h* in excess of the above-specified minimum lengths are not critical. As these lines become larger and larger, the mask corners become larger and larger, and the mask, and resulting mesa structure, deviate more and more from a square and become increasingly circular. As a practical matter, wafers 10 (FIG. 1) generally have a square shape (the wafers being sawed from much larger wafers, as known), and for maximum usage of the silicon of the starting wafer, the mesa structures also have a square shape. Accordingly, to the extent that the mesa corners become increasingly large, silicon area is wasted, and the power handling capacity of the device is reduced. To minimize such wastage, the corners are made as small as possible and, in one embodiment, comprise edges of the previously described minimum lengths. Again, as a practical matter, the corners actually comprise but a small portion of the overall mesa structure, and it is possible to use corner edges having lengths well in excess of the minimum lengths without significant change in the overall area of the mesa structure.

What is claimed is:

1. A method of fabricating a semiconductor device having a mesa structure comprising providing a generally rectangular etch mask on a <100> surface of a monocrystalline silicon wafer, said mask having straight sides meeting at curved corners, each of said corners being symmetrical about an axis passing through a point on the periphery of the corner, said mask straight sides being disposed at an angle of 45 degrees to <111> directions on said surface, and the periphery of each of said corners comprising, starting from said point, a pair of oppositely extending straight first lines forming an angle therebetween of around 150 degrees, each of said straight lines terminating in a curved line connecting said each straight line to its corresponding mask straight side, and anisotropically etching said wafer for providing a mesa structure underlying said mask.

2. A method according to claim 1 wherein said silicon wafer includes a highly doped region forming a P-N junction with a lightly doped region, the method including etching said wafer until the side walls of said mesa structure intercept and expose said P-N junction, wherein each said curved line in said mask has a curvature of 30 degrees and the length of each 6 degree segment of said curved line has a length at least equal to the vertical distance between a top surface of said mesa and the surface intercept of said P-N junction with the mesa structure side walls.

3. A method according to claim 1 wherein each of said curved lines comprises a plurality of end to end connected straight second lines, and each pair of connected second lines includes an angle equal to or less than 10 degrees.

4. A method according to claim 1 wherein said mesa structure has top and bottom spaced apart surfaces, and said structure includes, from said top surface towards said bottom surface, a first, heavily doped region of a first conductivity type, a second, lightly doped region of said first conductivity type, and a third, heavily doped region of a second conductivity type, each of said regions having a flat interface with an adjoining region, and including heating said mesa structure for causing dopants in said first region to diffuse downwardly and laterally into said second region.

5. A semiconductor rectifier having a mesa structure provided by a process comprising providing a generally rectangular etch mask on a <100> surface of a monocrystalline silicon wafer, said mask having straight sides meeting at curved corners, each of said corners being symmetrical about an axis passing through a point on the periphery of the corner, said mask straight sides being disposed at an angle of 45 degrees to <111> directions on said surface, and the periphery of each of said corners comprising, starting from said point, a pair of oppositely extending straight first lines forming an angle therebetween of about 150 degrees, each of said straight lines terminating in a curved line connecting said each straight line to its corresponding mask straight side, and anisotropically etching said wafer for providing a mesa structure underlying said mask.

6. A rectifier according to claim 5 wherein each said silicon wafer includes a highly doped region forming a P-N junction with a lightly doped region, the process including etching said wafer until the side walls of said mesa structure intercept and expose said P-N junction, wherein each said curved line in said mask has a curvature of 30 degrees and the length of each 6 degree segment of said curved line has a length at least equal to the vertical distance between a top surface of said mesa and the surface intercept of said P-N junction with the mesa structure side walls.

7. A rectifier according to claim 5 wherein each of said curved lines comprises a plurality of end to end connected straight second lines, and each pair of connected second lines including an angle equal to or less than 10 degrees.

8. A semiconductor rectifier comprising a monocrystalline silicon wafer having a major surface lying in the <100> crystal plane, a generally rectangular mesa structure extending upwardly from said surface, said mesa structure having spaced apart top and bottom surfaces interconnected by four side walls meeting at corner walls, horizontal edges of said side walls being disposed at an angle of 45 degrees to <111> directions on said major surface, each of said corner walls comprising a centrally positioned first triangular facet lying in the <111> crystal plane, and a plurality of planar second facets extending between each side of said triangular facet and a pair of said side walls, the planes of adjoining second facets being angularly off-set from one another, and the slopes of said second facets, with respect to said mesa structure bottom surface, being 45 degrees.

9. A rectifier according to claim 8 wherein the angular off-set between adjoining second facets is equal to or less than 4 degrees.

* * * * *